(12) United States Patent
Borot et al.

(10) Patent No.: US 7,989,914 B2
(45) Date of Patent: Aug. 2, 2011

(54) ANTI-FUSE CELL AND ITS MANUFACTURING PROCESS

(75) Inventors: Bertrand Borot, Le Cheylas (FR); Roberto Maurizio Gonella, Echirolles (FR); Sébastien Fabre, Eybens (FR)

(73) Assignees: STMicroelectronics Crolles 2 SAS, Crolles (FR); Koninklijke Philips Electronics N.V., Eindhoven (NL)

(*) Notice: Subject to any disclaimer, the term of this patent is extended or adjusted under 35 U.S.C. 154(b) by 218 days.

(21) Appl. No.: 11/793,990

(22) PCT Filed: Dec. 23, 2005

(86) PCT No.: PCT/EP2005/057150
§ 371 (c)(1),
(2), (4) Date: Nov. 9, 2007

(87) PCT Pub. No.: WO2006/069982
PCT Pub. Date: Jul. 6, 2006

(65) Prior Publication Data
US 2009/0102014 A1    Apr. 23, 2009

(30) Foreign Application Priority Data
Dec. 27, 2004 (EP) .................................. 04107005

(51) Int. Cl.
*H01L 29/00* (2006.01)
*H01L 21/44* (2006.01)

(52) U.S. Cl. ........ 257/530; 438/598; 438/132; 438/281; 257/209; 257/E23.147

(58) Field of Classification Search .................. 438/131; 257/50
See application file for complete search history.

(56) References Cited

U.S. PATENT DOCUMENTS

| 5,019,878 | A | * | 5/1991 | Yang et al. ..................... 257/390 |
| 5,298,784 | A | * | 3/1994 | Gambino et al. ............. 257/529 |
| 2003/0201514 | A1 | | 10/2003 | Radens et al. |
| 2004/0152262 | A1 | * | 8/2004 | Ichige et al. .................. 438/257 |
| 2004/0233768 | A1 | | 11/2004 | Kothandaraman |
| 2005/0067670 | A1 | * | 3/2005 | Hui .............................. 257/529 |
| 2006/0079086 | A1 | * | 4/2006 | Boit et al. ..................... 438/662 |

OTHER PUBLICATIONS

International Search Report from corresponding International Application No. PCT/EP2005/057150, filed Dec. 23, 2005.

* cited by examiner

*Primary Examiner* — Thanh V Pham
*Assistant Examiner* — Mohammad Choudhry
(74) *Attorney, Agent, or Firm* — Lisa K. Jorgenson; James H. Morris; Wolf, Greenfield & Sacks, P.C.

(57) ABSTRACT

An anti-fuse cell includes a standard MOS transistor of an integrated circuit, with source and drain regions covered with a metal silicide layer and at least one track of a resistive layer at least partially surrounding the MOS transistor, and adapted to pass a heating current such that the metal of said metal silicide diffuses across drain and/or source junctions.

45 Claims, 3 Drawing Sheets

US 7,989,914 B2

ANTI-FUSE CELL AND ITS MANUFACTURING PROCESS

BACKGROUND OF THE INVENTION

1. Field of the Invention

The present invention relates to one-time programmable cells for use in integrated circuits, and more particularly, anti-fuse cells.

2. Discussion of the Related Art

One-time programmable cells are cells which can be programmed from one state to another on one occasion, after which further modification is not possible, and the result is non-volatile.

Included in this category are fuses, which can be divided into fuses and anti-fuses. In the case of fuses, pre-existing connections are broken permanently during the programming whereas for anti-fuses, permanent connections are made between previously unconnected nodes.

A first type of fuse consists of a polysilicon track with a narrowed section and terminals for the application of a current. The track presents a resistance of a few tens of ohms between the terminals. When a high current is passed through the fuse, localized heating of the narrowed section occurs and fuses the track, making the resistance greater than one megohm. During the fusing process, the surrounding layers are liable to be damaged significantly, and the break is sometimes unreliable because residual filaments of polysilicon can remake the connection.

A second type of fuse consists of a metal track which provides a resistance of less than one ohm between the terminals. To program the fuse, laser radiation is used to fuse a portion of the track whereby a break occurs, creating a resistance greater than one megohm.

A first type of anti-fuse consists of an insulated gate MOS transistor. The terminals of the anti-fuse are formed by the gate electrode on one hand and the source and drain connected in common on the other, between which is presented a resistance greater than one megohm for the un-programmed fuse. The application of a high voltage between the gate and the substrate causes the rupture of the gate oxide creating a resistance in the order of hundreds of ohms between the gate electrode and the common source/drain electrodes.

A second type of anti-fuse consists of a MOS transistor connected in the off-state, its source and drain electrodes forming the terminals of the anti-fuse cell. When a high voltage is applied between the source and the drain of the MOS transistor, inducing the passage of a high current, permanent defects bridging the source-channel and drain-channel junctions are created. This results in a permanent connection of a few kilo-ohms between said source and drain So, generally, the electrically programmable fuses and anti-fuses, such as the above, have the disadvantage of requiring a high voltage for their programming, and hence a specific voltage supply source. Moreover, this voltage is significantly above the normal operating voltages of an integrated circuit technology, which requires the use of special/non-standard devices and process options.

The non-electrically programmable fuses present the disadvantage that programming is only possible while the integrated circuits are still in wafer form at the manufacturing site. Thus programming of product after packaging, for example by the end customer, is impossible. This programming is also time-consuming.

Also, generally known anti-fuses present a relatively high resistance when closed, excluding them from use in many applications, and often imposing an additional discriminator circuit to detect whether or not the link is closed.

Furthermore, generally known fuses and anti-fuses present a disadvantage in that the effect of programming cannot be verified without actually programming the cell. The decision to program a cell, often based on a prior measurement and a calculation, is open to error which results in the entire integrated circuit being rejected.

SUMMARY OF THE INVENTION

The present invention aims at solving at least some of the problems present in the prior art.

An feature of the present invention is to provide a cell which can be programmed with a low voltage.

Another feature of the present invention is to provide a fuse cell which can be programmed after integrated circuit packaging.

Another feature of the present invention is to provide an anti-fuse cell with a resistance less than ten ohms in the programmed state and a very high resistance in the un-programmed state.

Another feature of the present invention is to provide a fuse cell where the fusing process is not liable to impair neighboring structures and the resulting link is reliable.

Another feature of the present invention is to provide an anti-fuse cell associated with verification of the intended programming decisions.

At least one embodiment of the present invention provides an anti-fuse cell including a MOS transistor of a MOS integrated circuit, with source and drain regions covered with a metal silicide layer, and at least one track of a resistive layer at least partially surrounding said MOS transistor, and adapted to pass a heating current such that the metal of said metal silicide diffuses across drain and/or source junctions.

Another embodiment of the present invention provides a method of manufacturing an anti-fuse cell in an integrated circuit including standard MOS transistors, having source and drain regions containing a layer of metal silicide and being surrounded by insulating field regions, wherein each anti-fuse cell is made of an additional MOS transistor, and said method includes the following steps:

providing insulating field regions wider for said additional transistor than for said standard MOS transistors, forming simultaneously said additional transistor and said standard MOS transistors, forming at least one resistive track on the insulating field region around the periphery of said additional MOS transistor, simultaneously with the conductive layer of gates of the transistors.

The foregoing features, and advantages of the present invention, as well as others, will be discussed in detail in the following non-limiting description of specific embodiments in connection with the accompanying drawings.

As is conventional in the field of the representation of semiconductors, the various dimensions of the elements shown in the figures are simplified and are not drawn to scale.

Those skilled in the art will know how to choose the junction depths and lateral dimensions according to the desired performances.

DETAILED DESCRIPTION

Figure 1:
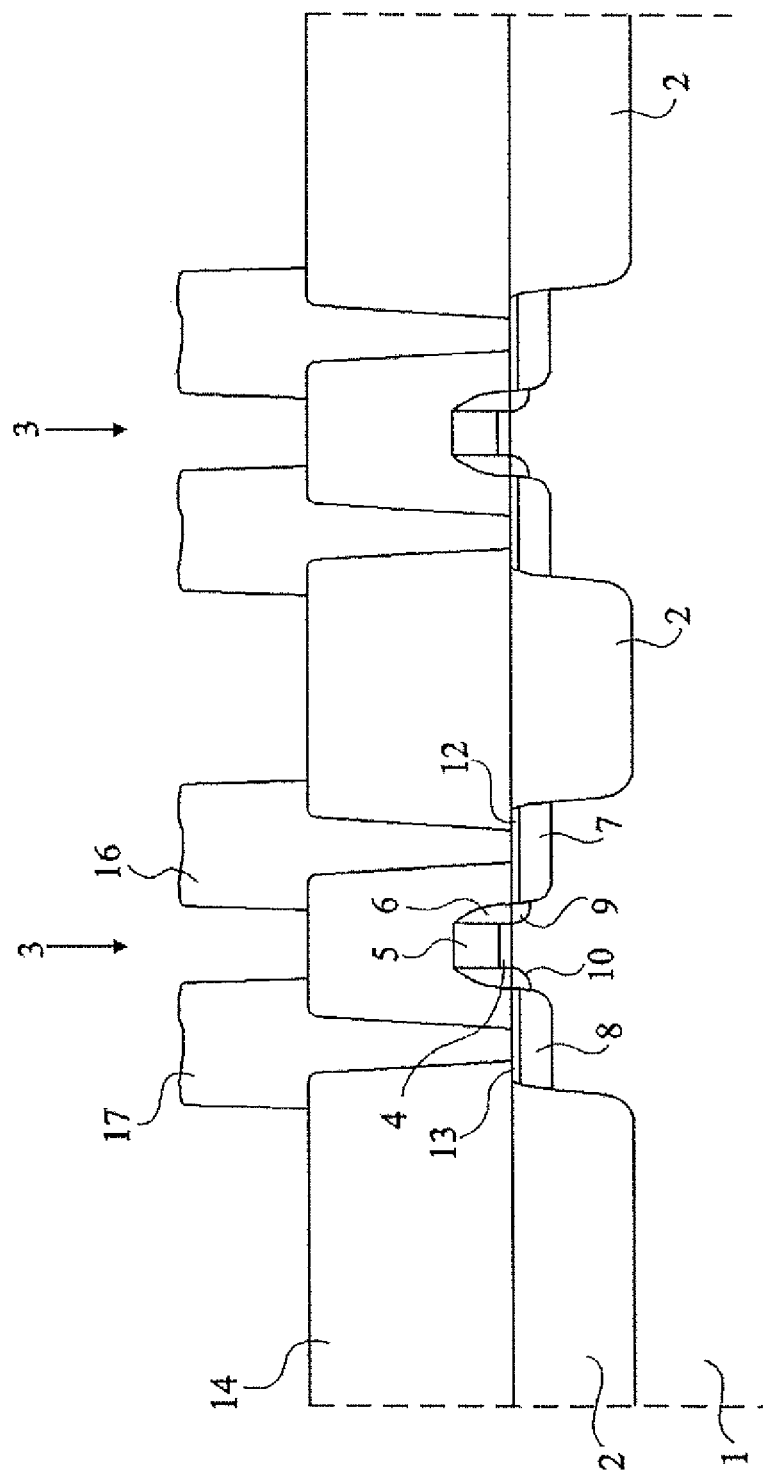
FIG. 1 is a cross sectional view illustrating an example of standard MOS transistors.

FIG. 1 is a cross sectional view of two conventional MOS transistors. This drawing is extremely simplified in that only the features useful to the discussion of the present invention are shown. Each MOS transistor is formed in a substrate 1, and surrounded by an insulating field region 2 of a certain width, that delimits an active area 3. Each MOS transistor comprises a gate dielectric 4, a gate electrode 5, surrounded by insulating spacers 6, source and drain regions 7 and 8 comprising LDD extensions 9 and 10. A layer of metal silicide 12 covers the upper surface of the source/drain regions 7, 8. A dielectric layer 14 covers the MOS transistor and insulating field regions. Vias 16, 17 contact the source and drain regions 7 and 8. Other interconnection structures (not shown) are formed over the wafer. Those skilled in the art will know variations of such a MOS transistor. In particular the MOS transistors are often formed not directly in the substrate but in specifically doped wells of different conductivity types.

According to an aspect of the invention, an anti-fuse cell according to the invention, manufactured in an integrated circuit including standard MOS transistors, uses elements identical to at least some of said standard MOS transistors.

Figure 2:
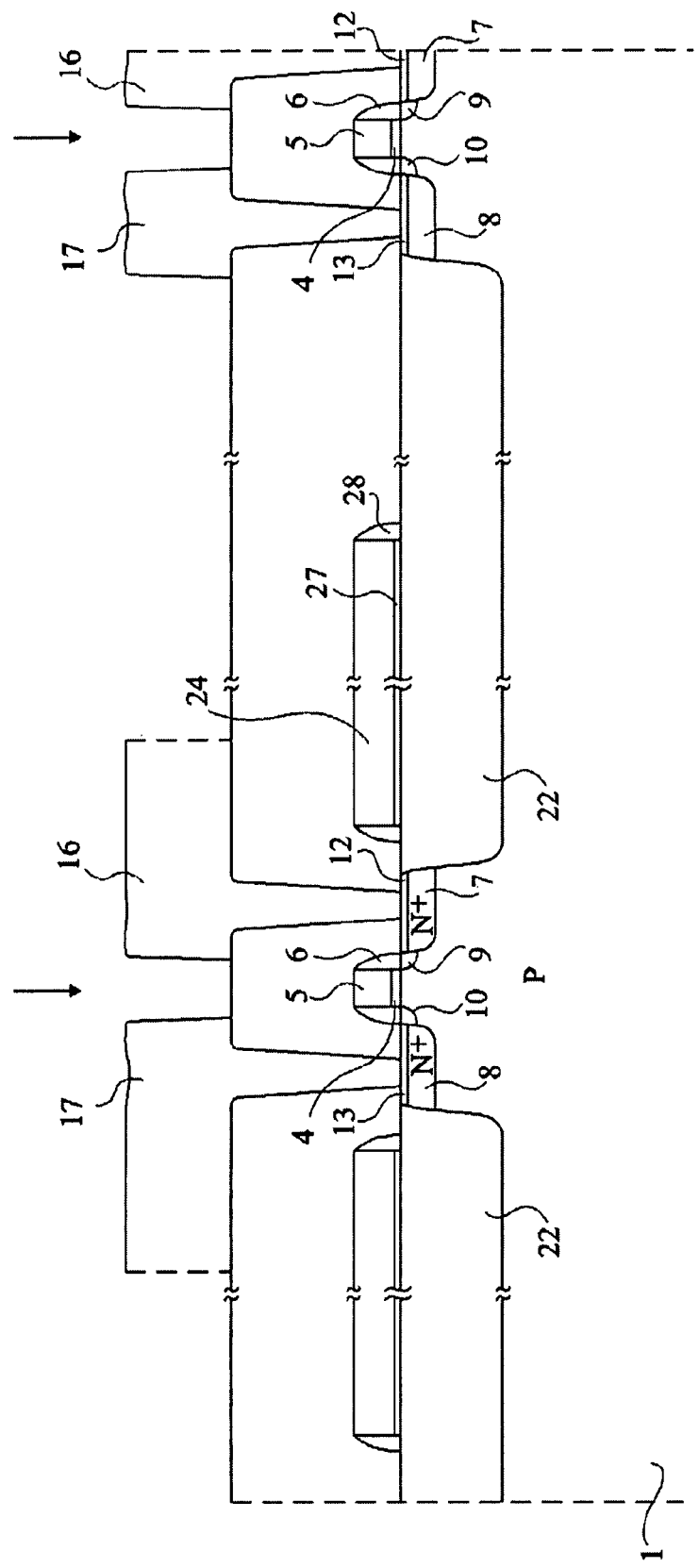
FIG. 2 is a cross sectional view illustrating an embodiment of the present invention.

FIG. 2 is a cross sectional view illustrating, in the right-hand portion, a standard MOS transistor, and on the left-hand portion, an anti-fuse cell according to an embodiment of the invention. The structure on the right-hand portion of FIG. 2 is not discussed further as it is the same as the structure disclosed in connection with FIG. 1.

The anti-fuse cell according to the invention includes the same elements as the standard MOS transistor shown on the right-hand portion of the figure and, accordingly, the constitutive portions of the anti-fuse cell are designated by the same references.

It is emphasized that the active area around the MOS transistor of an anti-fuse cell is delimited by an insulating field region 22 that is generally wider than the usual insulating field region 2 between standard MOS transistors.

Figure 3:
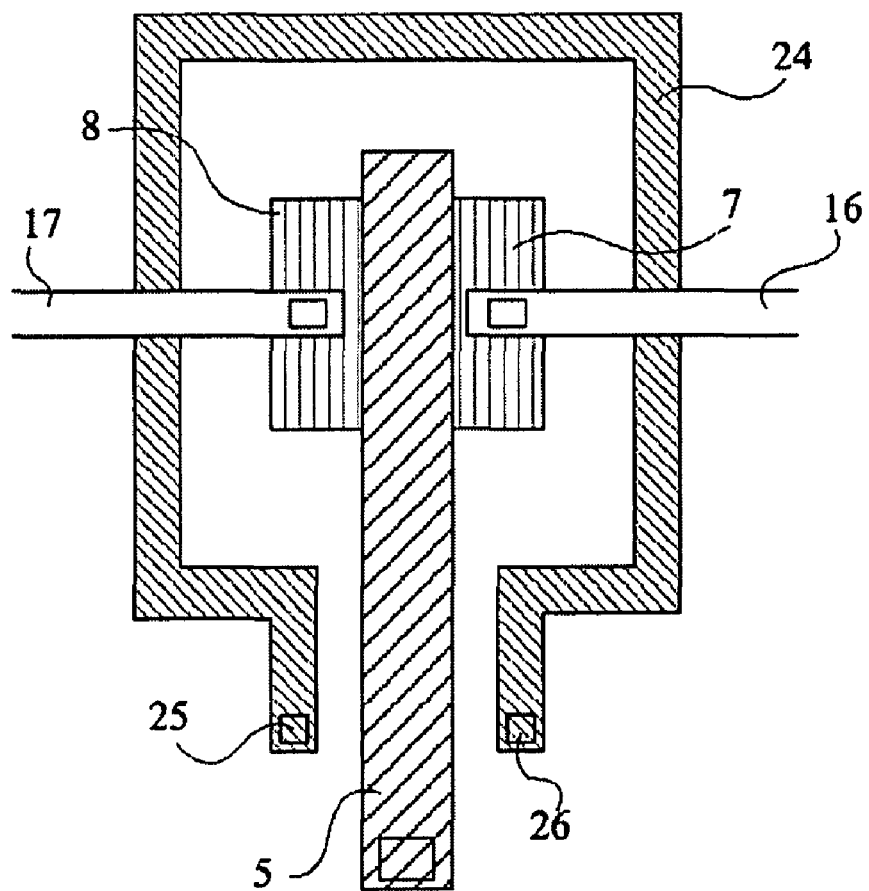
FIG. 3 is a view from above of the embodiment of FIG. 2.

The internal periphery of the insulating field region in the close neighborhood of the active area is covered by a conductive track 24 that can be better seen in the top view of FIG. 3. The track 24 includes terminals 25, 26 to which a supply voltage can be applied.

According to a preferred implementation of the invention, track 24 is formed simultaneously with the gates of the MOS transistors. This is why, in FIG. 2, an underlying insulating layer 27 corresponding to the gate oxide layer 4 and spacers 28 corresponding to the spacers 6 are shown.

The operation and the programming of the anti-fuse cell according to the invention will be disclosed hereinafter.

Immediately after manufacturing, the transistor of the anti-fuse cell according to the invention has the same features as a conventional MOS transistor, i.e. in the absence of a voltage on its gate, it presents a very high resistance between its source and drain terminals 16, 17.

To program the anti-fuse cell, a voltage is applied to terminals 25, 26 of the conductive track 24. This causes a heating of the neighboring region and in particular of the MOS structure situated inside the track. The heating is selected to be sufficient for obtaining a temperature such that the metal contained in the metal silicide (layers 12 and 13) diffuses inside the silicon. When the metal of at least one of the source or drain metal silicide attains the substrate through the drain or source region 7 or 8, or the LDD region 9 or 10, the corresponding junction is no longer rectifying. If only one junction is shorted, the device then operates as a diode. If both drain and source junctions are shorted, the device operates as a resistor. Due to the small size of presently manufactured MOS transistors, this resistor will have a very low value. This value is all the smaller as the diffusion depth from the metal silicide layer is increased.

Also, the invention draws advantage from the fact that silicon oxide is more thermally insulating than silicon. Accordingly, in particular if the field regions correspond to shallow trench isolation (STI) having a larger depth than the drain and source regions, it will be understood that the region situated at the level of and just under the MOS transistor will undergo a larger temperature increase than the region situated under the conductive track. Also, it will be emphasized that the conductive track is arranged on an internal side of the peripheral field oxide so that the transistors arranged on the other side of the conductive track are not accidentally programmed by the heating.

Accordingly, the invention provides, in a very simple way, without modifying the usual manufacturing process of a MOS integrated circuit, an efficient anti-fuse cell.

According to an advantage of the invention, as confirmed by experiments made by the inventors, the anti-fuse according to the invention can be programmed by applying a relatively low voltage to the above-mentioned resistive conductive track 24. For example, in a technology wherein the gate length is about 60 nm, and by providing a conductive track of a width of 1400 nm at 60 nm from the internal side of an insulating field region having a width of about 4500 nm and a depth of about 300 nm, it will be sufficient to apply a voltage of 3.3 volts at the terminals 25, 26 of the track. This causes a current of about 120 mA to flow in the conductive track during a time that causes a power dissipation of 400 mW. Then, at the level of the transistor of the anti-fuse cell, a temperature of about 400° C. is obtained, which is sufficient to cause a diffusion of a metal such as nickel used to form the silicide contact of the MOS transistor. Thus, the cell according to the invention is programmable with a relatively low voltage compatible with CMOS technologies.

Also, in the above-indicated technology, the active area of the MOS transistor will have a total length of 300 nm and the whole surface of the anti-fuse cell, including the peripheral insulating field region, for example a STI, will be about 5 $\mu m^2$. So, an anti-fuse cell according to the invention is smaller than most known fuses.

According to another advantage of the present invention, the result of a desired programming can be simulated before effectively implementing the permanent programming of an array of anti-fuse cells. Before programming, each anti-fuse cell transistor can also operate as a normal transistor. Thus, before programming a set of cells, the corresponding set of transistors can be made conductive by applying a voltage on their gates. Accordingly, the result of a projected programming can be checked before implementing the programming.

According to another advantage of the invention, it will be noted that an anti-fuse cell according to the invention can be programmed in the field, after having put a chip in a package. Indeed, as the resistive track according to the invention is generally covered by a relatively thick insulating layer, commonly a CVD oxide, the heating will not result into a substantial temperature increase in the direction of the upper side of the component. This is due to the fact that, as indicated above, the silicon is more thermally conductive than an insulator and, in particular a silicon oxide. Also, the heat is drawn towards the lower side of the component, due to the fact that, usually, the lower side of a component is linked to a heat sink.

Of course, the invention is liable of many variations that will appear to those skilled in the art within the scope of the invention as defined by the appended claims. In particular, the conductive track can be made of a plurality of sections or a plurality of concentric conductive tracks could be used.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. An anti-fuse cell including:
   a MOS transistor of a MOS integrated circuit, with source and drain regions covered with a metal silicide layer,
   an insulating field region surrounding said MOS transistor, and at least one track of a resistive layer separated from the MOS transistor by the insulating field region, the at least one track being adapted to conduct a heating current in the vicinity of the MOS transistor to generate heat such that the metal of said metal silicide diffuses across the drain and/or source junctions.

2. The cell of claim 1, wherein said resistive track is arranged over the insulating field region surrounding said MOS transistor, close to said MOS transistor.

3. The cell of claim 2, wherein the field insulating region surrounding said MOS transistor is wider than the insulating field regions surrounding other MOS transistors of the same integrated circuit.

4. The cell of claim 1, wherein said track is made of the same layer used to form the gate of said MOS transistor.

5. The cell of claim 1, wherein said track is provided with terminals for passing a current therein.

6. A method of manufacturing an anti-fuse cell in an integrated circuit including standard MOS transistors, each of the standard MOS transistors having source and drain regions containing a layer of metal silicide and being surrounded by insulating field regions, wherein each anti-fuse cell is made of an additional MOS transistor, the method comprising:
   providing insulating field regions wider for said additional MOS transistor than for said standard MOS transistors,
   forming simultaneously said additional MOS transistor and said standard MOS transistors, the forming comprising applying the layer of metal silicide to the source and drain regions of the additional MOS transistor, and
   forming at least one resistive track on the insulating field regions such that the at least one resistive track is separated from the additional MOS transistor by the insulating field regions, the at least one resistive track being formed simultaneously with a conductive layer of gates of the transistors, the at least one resistive track comprising a resistive material that generates a heat when the at least one resistive track conducts a current, wherein, for a given current, the resistive material generates a heat that is sufficient to cause the layer of metal silicide to diffuse into the source and/or drain regions of the additional MOS transistor to program the anti-fuse cell.

7. The method of claim 6, wherein the metal silicide is a nickel silicide.

8. The method of claim 6, wherein each MOS transistor has a gate length smaller than 100 nm.

9. The method of claim 6, wherein each field insulating region has a width of about 200 nm around each standard transistor, and a width of about 5000 nm around each anti-fuse cell, said insulating field region having a depth of some hundreds of nm.

10. The method of claim 6, further comprising programming the anti-fuse cell by applying to the at least one resistive track a voltage in a same range as voltages currently applied for operation of integrated circuit circuits.

11. A method of manufacturing an anti-fuse cell in an integrated circuit including a standard MOS transistor and an additional MOS transistor each having source and drain regions containing a layer of metal silicide and being surrounded by insulating field regions, wherein the anti-fuse cell comprises said additional MOS transistor, the method comprising:
    providing insulating field regions for said additional MOS transistor;
    forming simultaneously said additional MOS transistor and said standard MOS transistor the forming comprising applying the layer of metal silicide to the source and drain regions of the additional MOS transistor; and
    forming, simultaneously, at least one resistive track and conductive layers of gates of said standard MOS transistors, the at least one resistive track being formed on the insulating field regions and around the periphery of said additional MOS transistor, the at least one resistive track comprising a resistive material that generates a heat when the at least one resistive track conducts a current, wherein, for a given current, the resistive material generates a heat that is sufficient to cause the layer of metal silicide to diffuse into the source and/or drain regions of the additional MOS transistor to program the anti-fuse cell.

12. A method of using an anti-fuse cell of an integrated circuit including a standard MOS transistor and an additional MOS transistor separated by an insulating field region surrounding the additional MOS transistor, the method comprising:
    providing said integrated circuit including said standard MOS transistor and said additional MOS transistor, said additional MOS transistor having source and drain regions covered with a metal silicide layer and at least one track of a resistive layer disposed on the insulating field region, wherein the resistive layer generates a heat when the at least one track conducts a current, wherein, for a given current, the resistive material generates a heat that is sufficient to cause the metal silicide to diffuse into the drain and/or source regions, the at least one track of the resistive layer being separated from the additional MOS transistor by the insulating field region; and
    passing a current greater than or equal to the given current through the at least one track of the resistive layer to generate the heat to diffuse the metal silicide into the drain and/or source regions.

13. The method of claim 12, wherein passing the given current comprises applying a voltage to the at least one track of the resistive layer in a range of voltages applied for operation of integrated circuits.

14. The method of claim 12, wherein the field insulating region surrounding the additional MOS transistor is wider than an insulating field regions surrounding the standard MOS transistors of the same integrated circuit.

15. The method of claim 12, wherein each field insulating region has a width of about 200 nm around each standard transistor, and a width of about 5000 nm around each anti-fuse cell, the insulating field region having a depth of some hundreds of nm.

16. The method of claim 12, wherein the at least one track and a gate of the additional MOS transistor are formed of the metal silicide layer.

17. The method of claim 12, wherein the at least one track is provided with terminals for passing a current therein.

18. The method of claim 12, wherein the metal silicide is a nickel silicide.

19. The method of claim 6, wherein the standard MOS transistor and the additional MOS transistor each has a gate length smaller than 100 nm.

20. An apparatus comprising:
    an anti-fuse cell comprising:
        an insulating region;
        a MOS transistor formed within the insulating region, the MOS transistor including source and drain regions and at least one layer of metal silicide; and
        a resistive layer disposed on the insulating region and separated from the MOS transistor by the insulating region, the resistive layer being adapted to conduct a current and comprising a resistive material that, when the current is conducted, generates a heat that is applied to the MOS transistor, wherein, for a given current, the heat is sufficient to cause the at least one layer of metal silicide to diffuse into the source and drain regions.

21. The apparatus of claim 20, wherein the at least one layer of metal silicide is disposed on a surface of the source and/or drain regions.

22. The apparatus of claim 20, wherein the at least one layer of metal silicide is diffused into the source and/or drain regions.

23. The apparatus of claim 22, wherein the at least one layer of metal silicide is diffused into the source and/or drain regions and into a channel region of the MOS transistor.

24. The apparatus of claim 20, wherein the resistive layer is adapted to conduct the current without conducting any of the current to the MOS transistor.

25. The apparatus of claim 20, wherein the resistive layer comprises two terminals through which the current is conducted, the two terminals being connected by a track of the resistive layer.

26. The apparatus of claim 25, wherein the track is disposed in a same plane as a gate of the MOS transistor forms a ring around a majority of the gate of the MOS transistor.

27. The apparatus of claim 26, wherein the resistive layer is made of a same material as the gate of the MOS transistor.

28. An apparatus comprising:
    an anti-fuse cell comprising:
        a MOS transistor including source and drain regions and at least one layer of metal silicide;
        means for conducting a current to generate a heat, wherein, for a given current, the heat is sufficient to diffuse the at least one layer of metal silicide into the source and/or drain regions of the MOS transistor; and
        an insulating region separating the MOS transistor and the means for conducting the current.

29. The apparatus of claim 28, wherein the means for conducting the current to generate the heat generates the heat without applying any current to the MOS transistor.

30. The apparatus of claim 28, wherein the means for conducting the current to generate the heat comprises means for conducting the current to generate, for a given current, a heat sufficient to diffuse the at least one layer of metal silicide through the source and/or drain regions of the MOS transistor and into a channel region of the MOS transistor.

31. A method comprising:
    forming a MOS transistor on a substrate, the MOS transistor comprising source and drain regions, wherein forming the MOS transistor comprises applying at least one layer of metal silicide to the source and/or drain regions;
    forming an insulating region on the substrate; and
    forming a resistive layer, the resistive layer being separated from the MOS transistor by the insulating region, the resistive layer comprising a resistive material that generates a heat when the resistive layer conducts a current, wherein, for a given current, the resistive material generates a heat that is sufficient to cause the at least one layer of metal silicide to diffuse into the source and/or drain regions of the MOS transistor.

32. The method of claim 31, wherein forming the MOS transistor and forming the resistive layer comprises applying a same material to form a gate region of the MOS transistor and the resistive layer.

33. The method of claim 32, wherein applying a same material to form the gate region and the resistive layer comprising simultaneously applying the same material to form the gate region and the resistive layer.

34. The method of claim 31, wherein forming the resistive layer comprises forming the resistive layer in a same plane as a gate region of the MOS transistor, and
    wherein forming the resistive layer comprises forming the resistive layer as a ring around a majority of the gate region of the MOS transistor.

35. A method of programming an anti-fuse cell, the anti-fuse cell comprising a MOS transistor, an insulating region, and a resistive layer, the MOS transistor comprising a metal silicide layer coating source and/or drain regions of the MOS transistor, the resistive layer being separated from the MOS transistor by the insulating region, the method comprising:
    conducting a current through the resistive layer to generate heat sufficient to diffuse the metal silicide layer of the MOS transistor into the source and/or drain regions of the MOS transistor.

36. The method of claim 35, wherein conducting the current through the resistive layer comprises conducting the current without conducting any current through the MOS transistor.

37. The method of claim 35, wherein the resistive layer is formed as a ring around a majority of the MOS transistor, and wherein conducting the current through the resistive layer comprises conducting the current around the majority of the MOS transistor.

38. The method of claim 35, wherein conducting the current through the resistive layer to generate heat comprises conducting the current through the resistive layer to generate heat sufficient to diffuse the metal silicide layer of the MOS transistor through the source and/or drain regions of the MOS transistor and into a channel region of the MOS transistor.

39. The apparatus of claim 20, wherein the at least one layer of metal silicide is disposed on the source and/or drain regions.

40. The apparatus of claim 28, wherein the at least one layer of metal silicide is diffused into the source and/or drain regions.

41. The apparatus of claim 40, wherein the at least one layer of metal silicide is diffused into the source and/or drain regions and into a channel region of the MOS transistor.

42. The apparatus of claim 28, wherein the at least one layer of metal silicide is disposed on the source and/or drain regions.

43. The anti-fuse cell of claim 1, wherein the at least one track of the resistive layer is adapted to conduct the heating current in the vicinity of the MOS transistor without conducting the current to the MOS transistor.

44. The method of claim 6, wherein forming the at least one resistive track on the insulating field regions comprises forming the at least one resistive track of the resistive material such that the at least one resistive track generates the heat without conducting the current to the additional MOS transistor.

45. The method of claim 11, wherein forming the at least one resistive track comprises forming the at least one resistive track such that the at least one resistive track generates the heat without conducting the current to the additional MOS transistor.

* * * * *